United States Patent
Sasaoka et al.

(10) Patent No.: US 11,777,055 B2
(45) Date of Patent: Oct. 3, 2023

(54) LIGHT EMITTING DEVICE

(71) Applicant: NICHIA CORPORATION, Anan (JP)

(72) Inventors: Shimpei Sasaoka, Tokushima (JP); Toshiyuki Hashimoto, Anan (JP); Yoshihiro Sho, Anan (JP); Toshinobu Katsumata, Anan (JP)

(73) Assignee: NICHIA CORPORATION, Anan (JP)

( * ) Notice: Subject to any disclaimer, the term of this patent is extended or adjusted under 35 U.S.C. 154(b) by 160 days.

(21) Appl. No.: 17/349,183

(22) Filed: Jun. 16, 2021

(65) Prior Publication Data

US 2021/0313487 A1 Oct. 7, 2021

Related U.S. Application Data

(63) Continuation of application No. 16/585,419, filed on Sep. 27, 2019, now Pat. No. 11,069,831.

(30) Foreign Application Priority Data

Sep. 28, 2018 (JP) .................................. 2018-184769
Aug. 2, 2019 (JP) .................................. 2019-142995

(51) Int. Cl.
*H01L 33/54* (2010.01)
*H01L 33/08* (2010.01)
(Continued)

(52) U.S. Cl.
CPC .............. *H01L 33/08* (2013.01); *H01L 33/10* (2013.01); *H01L 33/502* (2013.01)

(58) Field of Classification Search
None
See application file for complete search history.

(56) References Cited

U.S. PATENT DOCUMENTS

2006/0256256 A1   11/2006   Seong et al.
2009/0231835 A1   9/2009   Roberts et al.
(Continued)

FOREIGN PATENT DOCUMENTS

JP   2001-318614 A   11/2001
JP   2006-317946 A   11/2006
(Continued)

OTHER PUBLICATIONS

Non Final Office Action in the related U.S. Appl. No. 16/585,419, dated Oct. 22, 2020.
(Continued)

*Primary Examiner* — Joseph C. Nicely
*Assistant Examiner* — Lamont B Koo
(74) *Attorney, Agent, or Firm* — Global IP Counselors, LLP

(57) ABSTRACT

A light emitting device includes a substrate, a plurality of light sources, a partitioning member, a light transmissive member, a plurality of reflecting portions. The light sources are arranged on the substrate. Each of the light sources has a light emitting diode. The partitioning member includes a plurality of wall portions defining a plurality of sections respectively surrounding at least one of the light sources, the wall portions including top portions. The light transmissive member is arranged above the light sources. The plurality of reflecting portions are arranged on a lower surface of the light transmissive member. Lower surfaces of the reflecting portions are positioned lower than apexes of the top portions of the wall portions of the partitioning member.

20 Claims, 4 Drawing Sheets

(51) Int. Cl.
*H01L 33/10* (2010.01)
*H01L 33/50* (2010.01)

(56) References Cited

U.S. PATENT DOCUMENTS

| | | | |
|---|---|---|---|
| 2017/0045779 A1* | 2/2017 | Kamiyoshihara | ........................... G02F 1/133608 |
| 2017/0122529 A1 | 5/2017 | Yamada | |
| 2018/0023784 A1 | 1/2018 | Tamura et al. | |
| 2018/0080625 A1 | 3/2018 | Yamada et al. | |

FOREIGN PATENT DOCUMENTS

| | | | |
|---|---|---|---|
| JP | 2008159451 A | 7/2008 |
| JP | 2011-124196 A | 6/2011 |
| JP | 2013-025945 A | 2/2013 |
| JP | 2017-092021 A | 5/2017 |
| JP | 2017-142984 A | 8/2017 |
| JP | 2017157278 A | 9/2017 |
| JP | 2018022683 A | 2/2018 |
| JP | 2018-045972 A | 3/2018 |

OTHER PUBLICATIONS

Notice of Allowance in the related U.S. Appl. No. 16/585,419, dated Mar. 26, 2021.

* cited by examiner

LIGHT EMITTING DEVICE

CROSS-REFERENCE TO RELATED APPLICATION

This application is a continuation application of U.S. patent application Ser. No. 16/585,419 filed on Sep. 27, 2019. This application claims priority to Japanese Patent Application No. 2018-184769 filed on Sep. 28, 2018 and Japanese Patent Application No. 2019-142995 filed on Aug. 2, 2019. The entire disclosures of U.S. patent application Ser. No. 16/585,419, Japanese Patent Application No. 2018-184769 and Japanese Patent Application No. 2019-142995 are hereby incorporated herein by reference in their entireties.

TECHNICAL FIELD

The present disclosure relates to a light emitting device.

BACKGROUND ART

A surface emitting device is known as a direct type of backlight used in liquid crystal televisions and the like. For instance, a surface emitting device disclosed in JP2013-25945A has a peripheral wall around a plurality of light sources, and has a frame disposed in the form of a matrix. This enables local dimming (also called partial drive), in which the emission area is divided into a plurality of areas, and the leakage of light to the outside of the area is prevented while the amount of light emission by each light source is controlled to increase the contrast ratio within the areas.

SUMMARY

However, in the case where the light sources are locally dimmed in a light emitting device such as in the above described publication, light that has been emitted from the light sources in a lit area and scattered and guided by a diffuser panel or the like will sometimes be incident on an unlit area adjacent to the lit area, which decreases the contrast ratio between unlit area and lit area.

The present invention has been conceived in light of the above problem, and provides a light emitting device with which the contrast ratio between lit areas and unlit areas can be further improved.

The present disclosure includes the following aspect.

A light emitting device includes a substrate, a plurality of light sources, a partitioning member, a light transmissive member, a plurality of reflecting portions. The light sources are arranged on the substrate. Each of the light sources has a light emitting diode. The partitioning member includes a plurality of wall portions defining a plurality of sections respectively surrounding at least one of the light sources, the wall portions including top portions. The light transmissive member is arranged above the light sources. The plurality of reflecting portions are arranged on a lower surface of the light transmissive member. Lower surfaces of the reflecting portions are positioned lower than apexes of the top portions of the wall portions of the partitioning member.

Certain embodiments in the present disclosure can realize the light emitting device with which the contrast ratio between lit areas and unlit areas can be further improved.

DETAILED DESCRIPTION

Figure 1A:
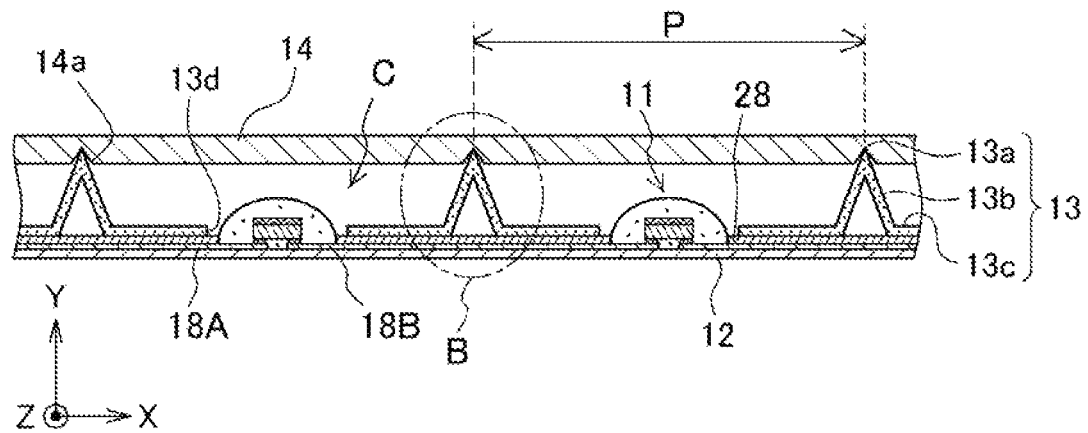
FIG. 1A is a schematic cross-sectional view showing a light emitting device according to an embodiment of the present disclosure.

The drawings referred to in the following description schematically show embodiments and, therefore, the scale, interval, positional relationship and the like of members may be exaggerated or partially omitted. Further, a plan view and a corresponding cross-sectional view may not coincide with each other in scale or interval of members. Further, in the following description, in principle, identical name and reference character denote an identical or similar member, and the detailed description thereof may be omitted as appropriate.

In the present embodiment, the light extraction surface side of the light source may be referred to as the upper surface or the upper side.

As shown in FIG. 1A, the light emitting device according to an embodiment of the present invention includes light sources 11, a substrate 12, a partitioning member 13, and a diffuser panel 14 (one example of a light transmissive member). A plurality of the light sources 11, each having light emitting diode, are disposed on the substrate 12. The partitioning member 13 surrounds each of the light sources 11 and has wall portions 13b having top portions 13a. A range (that is, the region and space) bounded by the wall portions 13b having the top portions 13a is defined as one section C, and the partitioning member 13 includes a plurality of these sections C. The diffuser panel 14 is disposed above the light sources 11 and has grooves 14a that accommodate the top portions 13a. A light emitting device such as one shown in FIG. 1A functions as a surface emission type light emitting device.

Since the top portions 13a of the partitioning member 13 are accommodated in the grooves 14a of the diffuser panel 14, the path over which light emitted from the light sources 11 would otherwise propagate through the diffuser panel 14 and enter adjacent areas can be effectively narrowed by these top portions 13a. This effectively prevents or reduces the entry of light into adjacent areas. As a result, in the case where an adjacent region is an unlit region, the contrast ratio can be further increased. Also, since the partitioning member 13 partially overlaps with the diffuser panel 14 in the height direction (i.e., the Y direction), the light emitting device can be made thinner, which in turns affords a more compact device.

Light Sources 11

The light sources 11 are members that emit light. For example, this encompasses a light emitting element that emits light itself, a light emitting element that has been sealed in a light-transmissive resin or the like, a surface mount type of light emitting device (LED) in which light emitting elements are packaged, and so forth.

Figure 1B:
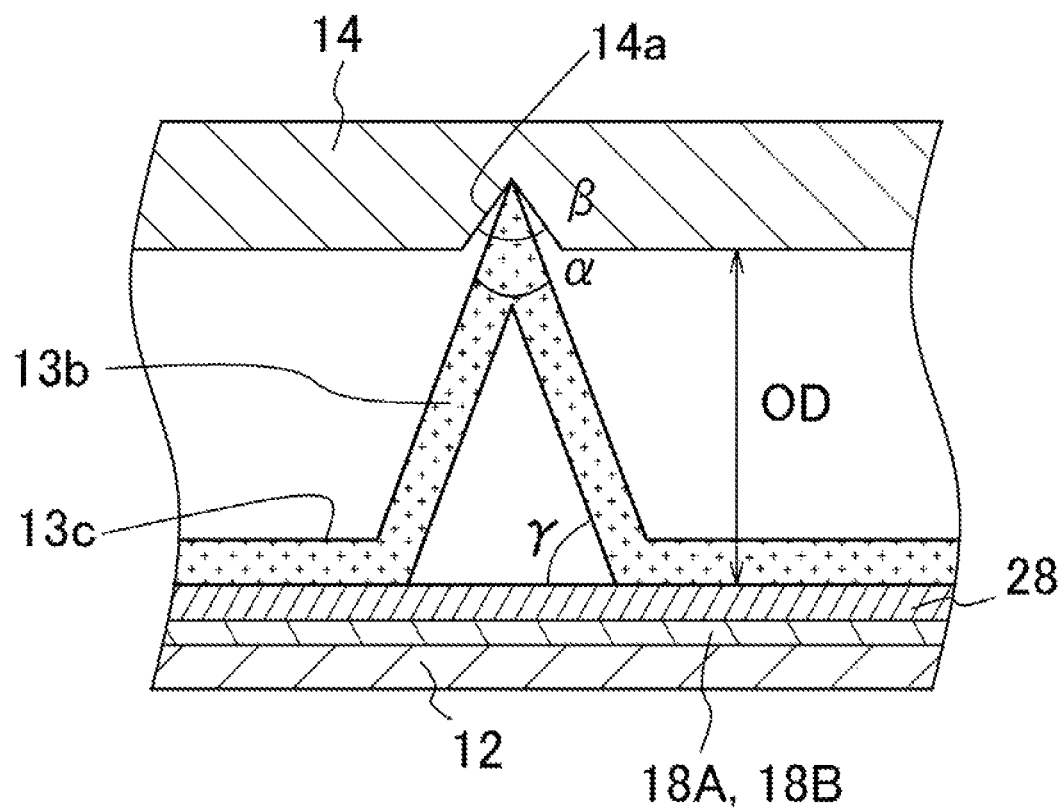
FIG. 1B is a partially enlarged schematic cross-sectional view showing a vicinity B of a partitioning member of the light emitting device of FIG. 1A.
Figure 1C:
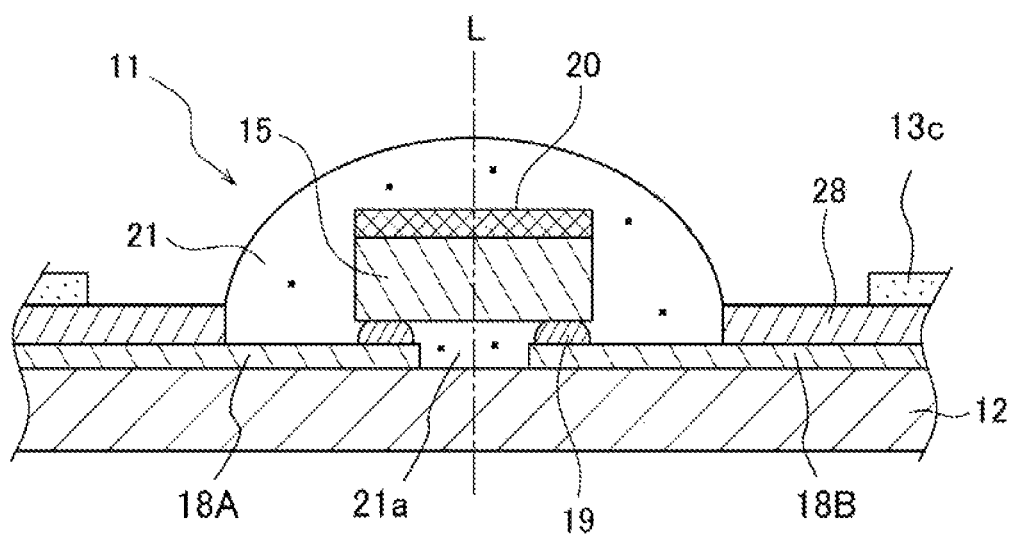
FIG. 1C is a partially enlarged schematic sectional view around the light emitting element of the light emitting device of FIG. 1A.

For example, as shown to FIG. 1C, examples of a light source 11 include one in which a light emitting element 15 is covered with a sealing member 21. The light source may use just one light emitting element 15, but a plurality of light emitting elements may also be used as a single light source.

The light sources 11 may be anything having light distribution characteristics, but they preferably distribute light over a wide area, in order for each section C (FIG. 1A) surrounded by the wall portion 13b of the partition member 13 (discussed below) to be illuminated will little luminance unevenness. It is particularly preferable in the case that each of the light sources 11 has a batwing light distribution. The result of this is that the amount of light emitted directly above a light source 11 is kept low, the light distribution of each light source is expanded, and the expanded light irradiates the wall portions 13b and the bottom surface 13c, which suppresses luminance unevenness in the sections C surrounded by the wall portions 13b.

Figure 4:
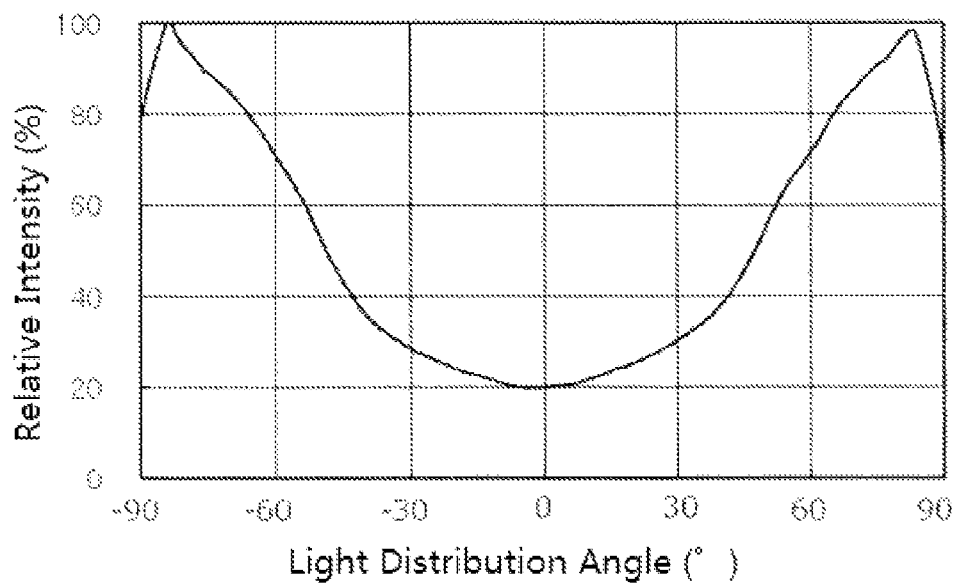
FIG. 4 is a graph showing the batwing light distribution characteristics of the light emitting element of the light emitting device of FIG. 1A.

Here, as shown in FIG. 4, a batwing light distribution characteristic is defined as one having an emission intensity distribution in which the emission intensity is greater than 0° at an angle where the light distribution angle has an absolute value larger than 0°, where the optical axis L is 0°. As shown in FIG. 1C, the optical axis L is defined here as a line that passes through the center of the light source 11 and is perpendicular to a line in the plane of the substrate 12 (discussed below).

In particular, as shown in FIG. 1C, an example of a light source 11 with a batwing light distribution is one that makes use of a light emitting element 15 having a light reflecting film 20 on its upper surface. With this configuration, upward light from the light emitting element 15 is reflected by the light reflecting film 20, the amount of light directly above the light emitting element 15 is kept lower, and a batwing light distribution can be obtained. The light reflecting film 20 can be formed directly on the light emitting element 15, so it is not necessary to separately combine a special lens for providing a batwing light distribution, which allows the light source 11 to be thinner.

The light reflecting film 20 formed on the upper surface of the light emitting element 15 may be a metal film of silver, copper, or the like, a dielectric multilayer film (a DBR film), or a combination of these. The light reflecting film 20 preferably has reflectance angle dependence with respect to the incident angle, for the emission wavelength of the light emitting element 15. More specifically, the reflectance of the light reflecting film 20 is preferably set to be lower at oblique incidence than at perpendicular incidence. This results in a more gradual change in luminance directly above the light emitting element, and suppresses extreme darkening such as a dark spot directly above the light emitting element.

An example of the light source 11 is one in which the height of the light emitting element 15 mounted directly on the substrate is between 100 μm and 500 μm. An example of the thickness of the light reflecting film 20 is from 0.1 μm to 3.0 μm. Even including the sealing member 21 (discussed below), the thickness of the light source 11 can be about 0.5 mm to 2.0 mm.

The plurality of light sources 11 can be driven independently of one another, and are preferably mounted on the substrate 12 (discussed below) so that light adjustment control (such as local dimming or HDR) can be performed for each light source.

Light Emitting Element 15

A known element can be used as the light emitting element 15. For example, a light emitting diode is preferably used as the light emitting element. A light emitting element having an arbitrary wavelength can be selected. For example, as the blue and green light emitting elements, those using nitride semiconductors can be used. As the red light emitting element, GaAlAs, AlInGaP or the like can be used. Further, a semiconductor light emitting element made of a material other than this may be used. The composition, emission color, size, number and the like of the light-emitting element to be used can be appropriately selected depending on the purpose.

As illustrated in FIG. 1C, the light emitting element 15 may be one that is flip-chip mounted via a bonding member 19 so as to straddle a pair of positive and negative conductor wirings 18A and 18B provided on the upper surface of the substrate 12. The light emitting element 15 may be not only flip-chip mounted but also face-up mounted. The bonding member 19 is a member for fixing the light emitting element 15 to a substrate or a conductive wiring. Example of the bonding member 19 include an insulating resin or a conductive member. In the case of flip chip mounting as illustrated in FIG. 1C, a conductive member is used. Specifically, Au-containing alloy, Ag-containing alloy, Pd-containing alloy, In-containing alloy, Pb—Pd-containing alloy, Au—Ga-containing alloy, Au—Sn-containing alloy, Sn-containing alloy, Sn—Cu-containing alloy, Sn—Cu—Ag containing alloys, Au—Ge containing alloys, Au—Si containing alloys, Al containing alloys, Cu—In containing alloys, and a mixture of metal and flux.

Sealing Member 21

The sealing member 21 covers the light emitting element for the purpose of protecting the light emitting element from the external environment, optically controlling the light outputted from the light emitting element, so forth. The sealing member 21 is formed from a light-transmissive material. This material can be a light-transmissive resin such as an epoxy resin, a silicone resin, or a resin obtained by mixing thereof, glass, or the like. Of these, considering light resistance and ease of molding, the use of a silicone resin is preferable. The sealing member 21 may contain a wavelength conversion material such as a phosphor which absorbs light from the light emitting element and emits light of a different wavelength from that of the output light from the light emitting element, a diffusing agent for diffusing light from the light emitting element, a colorant corresponding to the emission color of the light emitting element, or the like.

The phosphor, the diffusing agent, the colorant, and the like can be any type that is known in the art.

The sealing member 21 may be in direct contact with the substrate 12.

The sealing member 21 can be adjusted to a viscosity that will allow printing, dispenser coating, or the like, and can be cured by heat treatment or light irradiation. The shape of the sealing member 21 may, for example, be substantially hemispherical, a convex shape that is longer than it is wide in cross-sectional view (a shape in which the length in the Z direction in cross-sectional view is greater than the length in the X direction), a convex shape that is flat in cross-sectional view (a shape in which the length in the X direction in cross-sectional view is greater than the length in the Z direction), or circular or elliptical in top view.

The sealing member 21 may be disposed as an underfill 21a between the bottom surface of the light emitting element 15 and the upper surface of the substrate 12.

Substrate 12

The substrate 12 is a member for mounting a plurality of light sources 11, and as shown in FIG. 1C, its upper surface is provided with conductive wires 18A and 18B for supplying power to the light sources 11, such as the light emitting elements 15. The portions of the conductive wires 18A and 18B that do not perform electrical connection are preferably covered by a cover member 28.

The substrate 12 may be made from any material that can insulate and separate at least the pair of conductive wires 18A and 18B. Examples include ceramics, resins, and composite materials. Examples of ceramics include alumina, mullite, forsterite, glass ceramics, nitride-based (for example, AlN), carbide-based (for example, SiC), LTCC, and the like. Examples of the resin include phenol resin, epoxy resin, polyimide resin, BT resin, polyphthalamide (PPA), polyethylene terephthalate (PET), and the like. Examples of the composite material include those obtained by mixing the resin with an inorganic filler such as glass fiber, $SiO_2$, $TiO_2$, and $Al_2O_3$, a glass fiber reinforced resin (glass epoxy resin), a metal substrate having an insulating layer formed on a metal member, and the like.

The thickness of the substrate 12 can be appropriately selected, and the substrate may be either a rigid substrate or a flexible substrate that can be manufactured by a roll-to-roll method. The rigid substrate may be a thin, bendable rigid substrate.

The conductive wires 18A and 18B may be any be formed from any material that is electrically conductive, and can be anything that is normally used as a wiring layer in circuit boards and so on. A plating film, a light reflecting film, or the like may be formed on the surface of the conductive wires.

The cover member 28 is preferably formed from an insulating material. Examples of the material are the same as those given for the substrate material. If the cover member is one in which a white filler or the like is contained in one of the above-mentioned resins, the leakage or absorption of light can be prevented, which improves the light extraction efficiency of the light emitting device.

Partitioning Member 13

Figure 3:
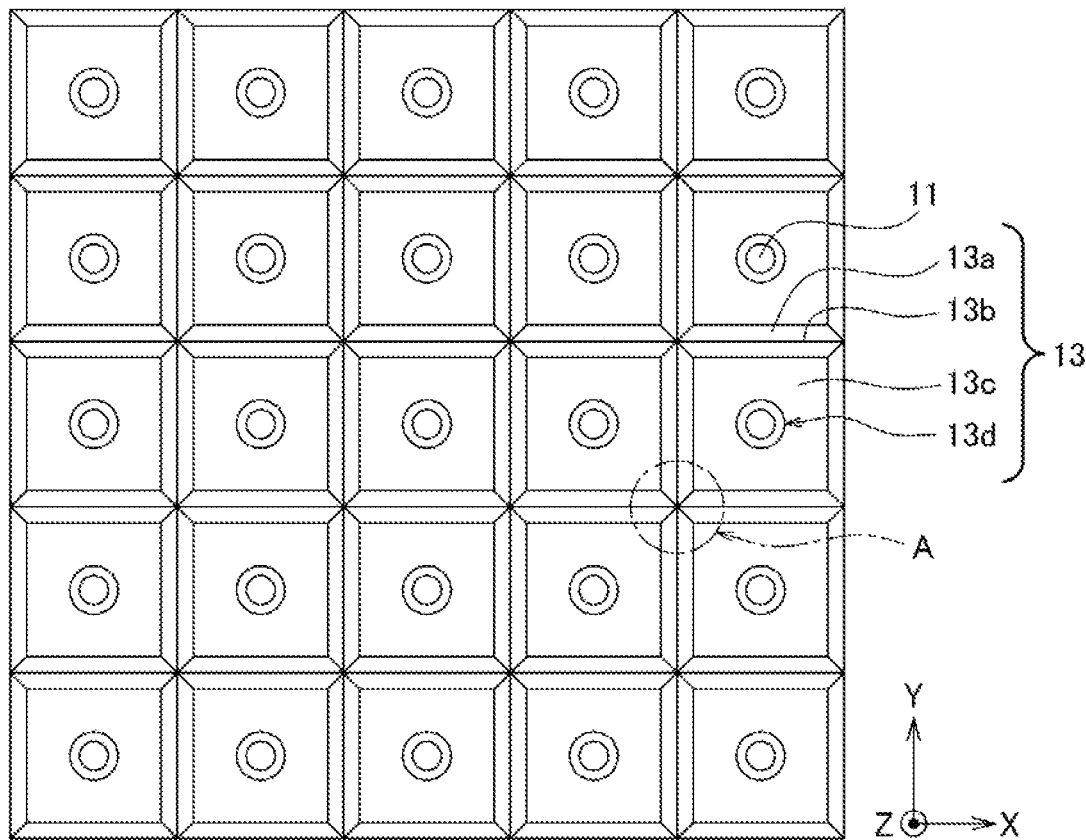
FIG. 3 is a schematic plan view of the light emitting device of FIG. 1A.

The partitioning member 13 surrounds each of the light sources 11 and has wall portions 13b equipped with top portions 13a. A range (region and space) bounded by the wall portions 13b, including the top portions 13a, is defined as one section C, and the partitioning member 13 is a member defining a plurality of these sections. Since the partitioning member 13 surrounds each of the light sources 11, the top portions 13a of the partitioning member 13 are arranged in a lattice or at a grid shape in plan view as shown in FIG. 3. Moreover, the wall portions 13b are arranged in a lattice (at a grid) shape in plan view. In plan view, the top portions 13a define the boundaries between adjacent sections C. The partitioning member 13 is preferably a reflective member. The partitioning member 13 preferably has bottom surfaces 13c in the sections C. In other words, in the partitioning member 13, a section C is constituted by a bottom surface 13c and wall portions 13b. A through-hole 13d is disposed substantially in the center of the bottom surface 13c of each section C. As shown in FIG. 1A, etc., the light sources 11 are preferably disposed in the through-holes 13d. The shape and size of a through-hole 13d may be such that the entire light source 11 is exposed from the bottom surface 13c, and the outer edge of the through-hole 13d is preferably located only in the vicinity of the light source 11. This allows the light from the light sources to be reflected by the bottom surfaces 13c as well if the partitioning member 13 is reflective, so the light extraction efficiency can be improved.

The top portions 13a are the highest parts of the wall portions 13b, and are preferably constituted by at least two wall portions 13b bounding an adjacent region. The top portions 13a may be flat, but are preferably in the form of a ridge constituted by at least two wall portions 13b bounding adjacent regions. That is, as shown to FIG. 1A, etc., a vertical cross-sectional view of the two or more wall portions 13b constituting the top portions 13a preferably constitutes an acute triangle, and more preferably constitutes an acute isosceles triangle. The acute angle of the acute triangle or the acute isosceles triangle, that is, the angle of the apex of the top portions (a in FIG. 1B), is preferably 90° to 120°, for example. Keeping the angle within this range reduces the space and region occupied by the partitioning member 13, and reduces the height of the partitioning member 13, affording a light emitting device that is smaller and thinner. Furthermore, the width of the grooves in the diffuser panel (discussed below) can be reduced, and a reduction in the light extraction efficiency can be prevented, or the light extraction efficiency can be increased.

The pitch P between the top portions 13a of the partitioning member 13 can be appropriately adjusted according to the size of the light source being used, the intended size and performance of the light emitting device, and so forth. For example, the pitch may be 1 mm to 50 mm, with 5 to 20 mm being preferable, and 6 mm to 15 mm even better.

It is preferable for the sections C to be constituted by the bottom surface 13c and the wall portions 13b surrounding the light sources 11, which are surfaces that are inclined so as to spread out toward the top from near the upper surface of the substrate 12. The angle of the wall portions 13b (γ in FIG. 1E) is 45° to 60°, for example.

Also, the height of the partitioning member 13 itself, that is, the length from the lower surface of the bottom surface 13c to the top portions 13a of the partition member 13, is preferably 8 mm or less, and in the case of a thinner light emitting device, about 1 mm to 4 mm. The distance OD from the lower surface of the bottom surface 13c to the lower surface of the diffuser panel 14 is preferably about 8 mm or less, and in the case of a thinner light emitting device, about 2 mm to 4 mm. This allows the backlight unit, including the diffuser panel 14 and other such optical members, to be extremely thin.

The thickness of the partitioning member 13 is 100 μm to 300 μm, for example.

The shape of the sections C bounded by the partitioning member 13, that is, the shape of the regions delineated by the wall portions 13b, may be, for example, circular, elliptical, or the like in plan view, but in order for the light sources to be disposed more efficiently, a polygonal shape such as triangular, square, hexagonal, or the like is preferable. This makes it easier to partition the light emitting area into the desired number of sections with the wall portions 13b according to the surface area of the emission surface of the surface light emitting device, and allows the light emitting areas to be disposed at higher density. The number of sections C partitioned by the wall portions 13b can be set as needed, and the shape and layout of the wall portions 13b, the number of the sections C, and so on can be changed according to the desired size of the light emitting device.

Depending on the number and position of the light sources 11 disposed on the substrate 12, the partitioning member 13 can have any of various shapes in plan view, such as one in which three sections C are adjacent and the ends of three top portions come together in a single point, one in which four sections C are adjacent and four top portions come together as shown in FIG. 3, and one in which six sections C are adjacent and six top portions come together.

The partitioning member 13 is preferably disposed on the substrate 12, and the lower surface of the bottom surface 13c of the partition member 13 and the upper surface of the substrate 12 are preferably fixed. It is particularly favorable if a light reflective adhesive member is used to fix around the through-hole 13d so that the light emitted from the light source 11 will not be incident between the substrate 12 and the partitioning member 13. For example, it is more preferable to dispose a light reflective adhesive member in a ring shape around the outer edge of the through-hole 13d. The adhesive member may be a double-sided tape, or a hot-melt adhesive sheet, or an adhesive that is based on a resin such as a thermosetting resin or thermoplastic resin. These adhesive members preferably have high flame retardance. However, the partitioning member 13 may be fixed on the substrate 12 by using screws or the like.

As described above, partitioning member 13 is preferably light reflective. This allows the light emitted from the light sources 11 to be efficiently reflected by the wall portions 13b and the bottom surface 13c. In particular, in the case where the wall portions 13b are inclined as mentioned above, the light emitted from the light sources 11 irradiates the wall portions 13b and can be reflected upward. Therefore, even in the case where an adjacent section C is not lit, the contrast ratio can be further improved. Also, the upward reflection of light can be carried out more efficiently. Furthermore, as will be described below, the top portions 13a of the partitioning member 13 that are accommodated (inserted) in the grooves 14a allow light that is propagating within the diffuser panel 14 (discussed below) to be effectively reflected upward.

The partitioning member 13 may be formed using a resin or the like containing a reflective material composed of metal oxide particles such as titanium oxide, aluminum oxide, silicon oxide, or the like, or a reflective material may be provided on the surface after molding with a resin that does not contain a reflective material. It is preferable for the reflectance with respect to the light emitted from the light sources 11 to be set to at least 70%.

The partitioning member 13 can be formed by molding in a mold, a molding method involving rapid prototyping, or the like. Molding methods involving the use of a mold include injection molding, extrusion molding, compression molding, vacuum molding, pressure molding, press molding, and the like. For instance, if a reflective sheet formed from PET or the like is subjected to vacuum molding, a partitioning member 13 can be formed in which the bottom surface 13c and the wall portions 13b are formed integrally.

In the partitioning member 13, a plurality of sections C are arranged in a row, a column, or a matrix. For example, as shown in FIG. 3, the light sources 11 can be bounded by the wall portions 13b on a substrate in which five light sources 11 are disposed in the X direction and five in the Y direction, for a total of 25 light sources arranged in a matrix, so that in top view there are 25 substantially square sections C, and through-holes 13d for mounting the light sources 11 are located on the bottom surface 13c, substantially in the center of the sections C.

Diffuser Panel 14

The diffuser panel 14 is a member that diffuses and transmits incident light, and it is preferable for one diffuser panel to be disposed above the plurality of light sources 11. The diffuser panel 14 is preferably a flat, plate-like member, but recesses and protrusions may be disposed on its surface. The diffuser panel 14 is preferably disposed substantially parallel to the substrate 12. The diffuser panel 14 can be made of, for example, a material that absorbs very little visible light, such as a polycarbonate resin, a polystyrene resin, an acrylic resin, or a polyethylene resin. In order to diffuse incident light, the diffuser panel 14 may be provided with recesses and protrusions on its surface, or a material having a different refractive index may be dispersed in the diffuser panel 14.

The recesses and protrusions can be 0.01 mm to 0.1 mm in size, for example.

The material with a different refractive index can be selected from among polycarbonate resins, acrylic resins, and so forth, for example.

The thickness of the diffuser panel 14 and the degree of light diffusion can be set as appropriate, and a commercially available member can be used as a light diffusion sheet, a diffuser panel film, or the like. For example, the thickness of the diffuser panel 14 can be 1 mm to 2 mm.

As shown in FIG. 1B, the diffuser panel 14 has grooves 14a that accommodate the top portions 13a of the partitioning member 13 on the side facing the substrate 12. The top portions 13a of the partitioning member 13 are in direct or indirect contact with the diffuser panel 14 inside these grooves 14a. That is, the top portions 13a may be accommodated by themselves in the grooves 14a, or the top portions 13a may be coated with a light-transmissive or reflective adhesive or the like, for example, and the top portions 13a may be fixed in the grooves 14a via this adhesive, or as will be described below, in the case where the diffuser panel 14 includes a reflective member, the top portions 13a may be accommodated in the grooves 14a via this reflective member (the reflective member is sandwiched between the diffuser panel 14 and the top portions 13a). The grooves 14a of the diffuser panel 14 are arranged in a lattice shape in plan view.

The shape of the grooves 14a in plan view may be, for example, such that they are disposed so as to surround the square sections C, or they may be disposed so as to surround sections C that are triangular, hexagonal, etc. The shape of the grooves 14a in cross-sectional view may be a U shape or an open-ended box shape, but as shown to FIG. 1B, a V shape is preferable. The inclination angle (apex angle) of the V shape (β in FIG. 1B) can be appropriately adjusted depending on the shape of the top portions 13a of the partitioning member 13, the inclination angle γ of the wall portions 13b, and so forth. For example, the angle β of the V shape of the grooves 14a is preferably such that a β, in particular, in the case where the apex angle α of the top portions is equal to or less than 90°. The angle β is more preferably about 0.5° to 5° greater than the angle α, for example. Setting the angle in this way allows the top portions 13a to penetrate more deeply into the grooves 14a, so that the top portions 13a will impede the lateral travel of the light emitted from the light sources 11, and reflect it upward. As a result, the contrast ratio between lit and unlit areas can be improved.

The depth of the grooves 14a is preferably at least one-half the thickness of the diffuser panel 14, and preferably four-fifths or less. Put another way, the range may be from 0.5 mm to 1.6 mm.

In the case where the pitch between the top portions 13*a* of the partitioning member 13 is P, the diffuser panel 14 is preferably disposed such that the distance OD between the diffuser panel and the substrate 12 on which the light sources are mounted, for example, 0.3P or less, with 0.25P or less being more preferable. Here, as shown in FIG. 1B, the distance OD refers to the distance from the outermost surface of the mounting base (the substrate 12), that is, from the outermost surface in the case that the mounting base has on its surface a covering layer, a wiring layer, etc., to the lower surface of the diffuser panel 14. Put another way, as shown in FIG. 1B, for example, the diffuser panel 14 is preferably such that the distance OD from the upper surface of the bottom surface 13*c* of the partitioning member 13 is preferably 1.5 mm to 5 mm, and more preferably 2 mm to 3 mm.

Other Components

Reflecting Member

The light emitting device in this embodiment may have a reflecting member.

Figure 2A:
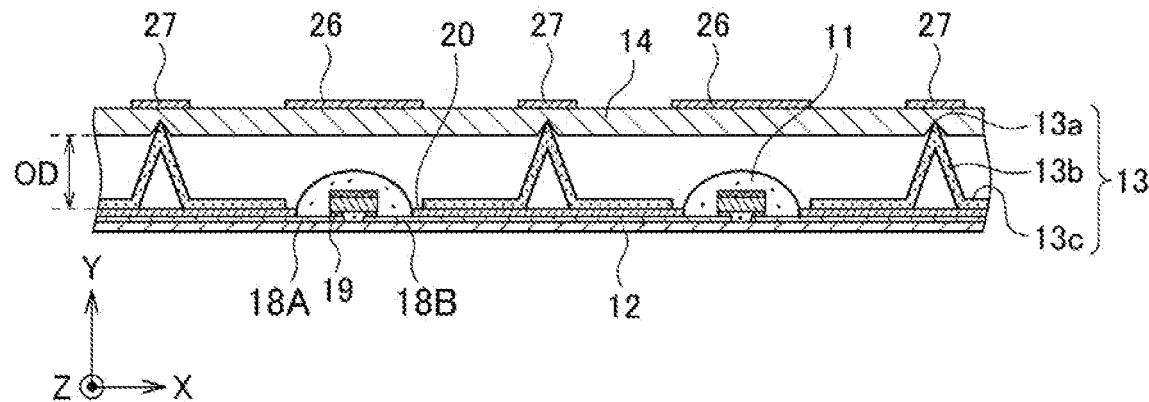
FIG. 2A is a schematic cross-sectional view showing a light emitting device according to another embodiment of the present disclosure.

For example, as shown in FIG. 2A, the diffuser panel 14 may have first reflecting portions 26 disposed on its upper surface above the light sources, and preferably directly over each of the light sources. The distance between the diffuser panel 14 and the light sources 11 is shortest in the regions above the light sources, and particularly the regions directly above them. Therefore, the luminance in these regions is higher. The shorter is the distance between the diffuser panel 14 and the light sources 11, the more pronounced will be the luminance unevenness between the regions directly above the light sources 11 and the regions where the light sources are not disposed. Therefore, in the case that the first reflecting portions 26 are provided on the surface of the diffuser panel 14, some of the highly directional light from the light sources 11 will be reflected and go back toward the light sources 11, and this reduces the luminance unevenness.

Second reflecting portions 27 may also be disposed on the upper surface of the diffuser panel 14, around the grooves 14*a* or above the top portions 13*a* of the partitioning member 13, and preferably directly above the top portions 13*a*.

In the case where the top portions 13*a* are locally dimmed, the top portions 13*a* will be a region that serves as the boundary between an unlit region and a lit region, so disposing these second reflecting portions 27 at these sites will prevent the light from lit regions from leaking into unlit regions, and light headed toward unlit regions can be reflected above the light sources 11.

The first reflecting portions 26 and the second reflecting portions 27 can be formed from a material that includes a light reflecting material. Examples include organic solvents and/or resins that contain a light reflecting material. Examples of light reflecting materials include titanium oxide, aluminum oxide, silicon oxide, and other such metal oxide particles. The resin and the organic solvent can be appropriately selected by taking into account the metal oxide particles to be used, the characteristics required for the light emitting device to be manufactured, and so on. It is especially favorable to use as the resin a photosetting resin that is light-transmissive and whose main component is an acrylate resin, an epoxy resin, or the like.

The reflectance of the first reflecting portions 26 and that of the second reflecting portions 27 may be the same or different. In the case where the reflectance is different, it is preferable to set the reflectance of the second reflecting portions 27 to be lower than that of the first reflecting portions 26. The portion that becomes the boundary between lit and unlit regions during local dimming will be the farthest from the light sources 11, and will be darker since there is less illumination. Therefore, by lowering the reflectance below that of other portions, and increasing the luminance directly above the top portions 13*a*, the boundary between the two regions can be made less pronounced in the case that two adjacent areas are lit.

The materials constituting the first reflecting portions 26 and the second reflecting portions 27 may further contain a pigment, a light absorbent material, a phosphor, or the like.

The first reflecting portions 26 and the second reflecting portions 27 can have various shapes or patterns, such as a specific pattern of stripes, an island pattern, or the like. The method of forming the first reflecting portions 26 and the second reflecting portions 27 may be any method that is known in this field, such as printing, inkjet, spraying, or the like.

The thickness of the first reflecting portions and the second reflecting portions is 10 µm to 100 µm, for example.

Figure 2B:
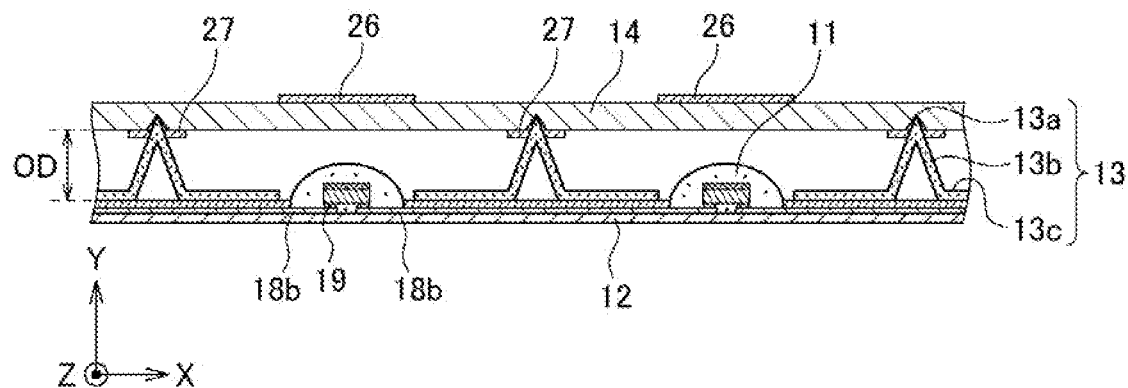
FIG. 2B is a schematic cross-sectional view showing a light emitting device according to still another embodiment of the present disclosure.

Also, as shown in FIG. 2B, the first reflecting portions 26 may be disposed on the upper surface of the diffuser panel 14, above the light sources, and preferably directly above the light sources, and on the lower surface, the second reflecting portions 27 may be disposed around the grooves 14*a* or above the top portions 13*a* of the partitioning member 13, and preferably directly above the top portions 13*a*. In this case, the contrast ratio can be further increased while suppressing the luminance reduction rate.

Figure 2C:
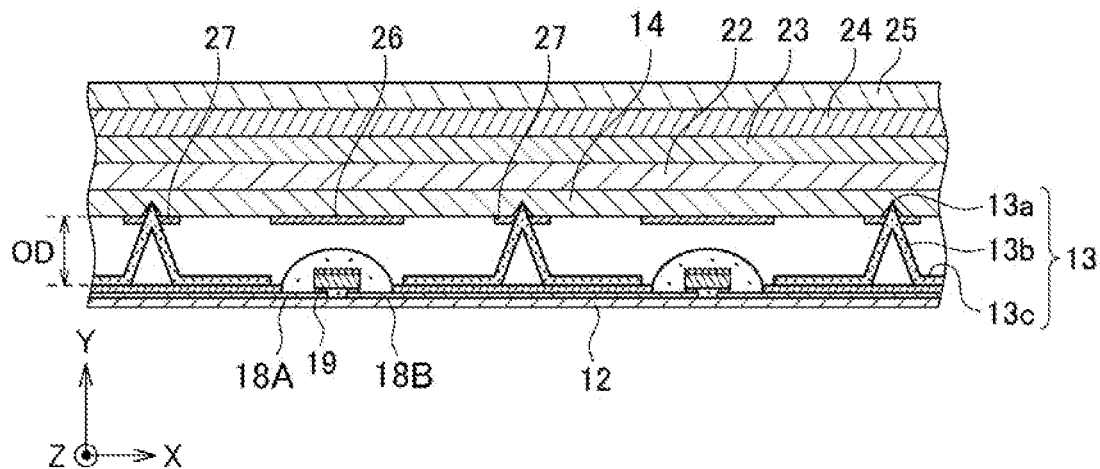
FIG. 2C is a schematic cross-sectional view showing a light emitting device according to still another embodiment of the present disclosure.

Furthermore, as shown in FIG. 2C, the first reflecting portions 26 may be disposed on the lower surface of the diffuser panel, above the light sources, and preferably directly above the light sources, and the second reflecting portions 27 may be disposed around the grooves 14*a* or above the top portions 13*a* of the partitioning member 13, and preferably directly above the top portions 13*a*. In the case where the second reflecting portions 27 are disposed on the lower surface of the diffuser panel 14, the second reflecting portions 27 may have openings corresponding to the grooves 14*a*, or may be disposed along the side walls of the grooves 14*a*.

In the case where the first reflecting portions 26 are disposed on the upper surface, the light diffusion distance can be increased by the thickness of the diffuser panel 14. Also, the reflectance of the first reflecting portions 26 may be lower after the light has been diffused by the diffuser panel 14, so the luminance reduction rate can be minimized.

In the case where the light diffused by the diffuser panel 14 is reflected upward by the second reflecting portions 27, the second reflecting portions 27 are preferably disposed on the lower surface of the diffuser panel 14. Also, in the case where the light diffused by a member higher than the diffuser panel 14 is reflected upward by the second reflecting portions 27, the second reflecting portions 27 are preferably disposed on the upper surface of the diffuser panel 14.

The diffuser panel 14 may have third reflecting portions on its upper surface and/or lower surface. The third reflecting portions are disposed at a site where three or more sections C are adjacent to each other, that is, directly above the site where three or more of the top portions 13*a* come together. The phrase "site where three or more of the top portions 13*a* come together" refers to the site indicated by A in FIG. 3, for example. The third reflecting portions preferably have a lower reflectance than the second reflecting portions 27. Of the top portions 13*a* that are irradiated with little of the light from the light sources 11, the site where the top portions 13*a* come together is even darker. Therefore, in the case that the reflectance of the third reflecting portions is set lower than that of the second reflecting portions, luminance unevenness within a lit area can be reduced during local dimming. As a result, the contrast ratio can be increased.

Also, the light emitting device may have, above the diffuser panel, one or more members of the group consisting of a polarizing sheet, a prism sheet, and a wavelength conversion sheet for converting the light from the light sources into light of a different wavelength. More specifically, as shown in FIG. 2C, a wavelength conversion sheet 22, prism sheets (a first prism sheet 23 and a second prism sheet 24), a polarizing sheet 25, and other such optical members are disposed, directly (or in contact with) or indirectly (or, on the upper surface of the diffuser panel 14 or a specific distance above the diffuser panel 14, and a liquid crystal panel is further disposed thereon, thereby producing a surface emission type of light emitting device that is used as a light source for direct type of backlight. The order in which these optical members are stacked can be set as needed.

Wavelength Conversion Sheet 22

The wavelength conversion sheet 22 may be disposed on either the upper surface or the lower surface of the diffuser panel 14, but is preferably disposed on the upper surface as shown in FIG. 2C. The wavelength conversion sheet 22 absorbs some of the light emitted from the light sources 11 and emits light of a wavelength different from the wavelength of the light emitted from the light sources 11. For example, the wavelength conversion sheet 22 may absorb some of the blue light from the light sources 11 to emit yellow light, green light, and/or red light, so that the light emitting device can emit white light. Since the wavelength conversion sheet 22 is separated from the light emitting elements of the light sources 11, it is possible to use a phosphor or the like having poor resistance to heat or optical intensity, which is difficult to use near a light emitting element. This makes it possible to improve the performance of the light emitting device as a backlight. The wavelength conversion sheet 22 is in the form of a sheet shape or a layer, and includes the above-described phosphor and the like.

First Prism Sheet 23 and Second Prism Sheet 24

The first and second prism sheets 23 and 24 have arranged on their surface a plurality of prisms extending in a specific direction. For example, the first prism sheet 23 has a plurality of prisms extending in the y direction in the case that the plane of the sheet is viewed in two dimensions of the x direction and the y direction (perpendicular to the x direction), and the second prism sheet 24 can have a plurality of prisms extending in the x direction. The prism sheets can refract light incident from various directions in a direction toward the display panel opposite the light emitting device. Consequently, light emitted from the emission surface of the light emitting device can be emitted mainly in a direction perpendicular to the upper surface, and the luminance in the case that the light emitting device is viewed from the front can be increased.

Polarizing Sheet 25

The polarizing sheet 25 selectively transmits light having a polarization direction that matches the polarization direction of a polarizing plate disposed on the display panel, such as on the backlight side of a liquid crystal display panel, and reflects the polarized light that is perpendicular to the polarization direction to the side of the first and second prism sheets 23 and 24. Some of the polarized light returning from the polarizing sheet 25 is reflected again by the first and second prism sheets 23 and 24, the wavelength conversion sheet 22, and the diffuser panel 14. At this point, the polarization direction changes. For example, it is converted into polarized light having the polarization direction of the polarizing plate of the liquid crystal display panel, and is again incident on the polarizing sheet 25 and emitted to the display panel. Consequently, the polarization direction of the light emitted from the light emitting device can be aligned, and light in the polarization direction, which is effective at improving the luminance of the display panel, can be emitted very efficiently. The polarizing sheet 25, the first and second prism sheets 23, 24, and so forth can be commercially available products sold as optical members for backlight use.

The light-emitting device of the present invention can be used for various light-emitting devices such as a backlight light source for a display device and a light source for a lighting device.

What is claimed is:

1. A light emitting device comprising:
   a substrate;
   a plurality of light sources arranged on the substrate, each of the light sources having a light emitting diode;
   a partitioning member including a plurality of wall portions defining a plurality of sections respectively surrounding at least one of the light sources, the wall portions including top portions;
   a light transmissive member arranged above the light sources; and
   a plurality of reflecting portions arranged on a lower surface of the light transmissive member so that the lower surface of the light transmissive member includes covered regions covered by the reflecting portions and exposed regions exposed from the reflecting portions to allow a part of light emitted from the light sources to enter the lower surface of the light transmissive member in the exposed regions without passing through the reflecting portions, each of the exposed regions being arranged between a corresponding one of the light sources and the wall portions surrounding the corresponding one of the light sources in a plan view, lower surfaces of the reflecting portions being positioned lower than apexes of the top portions of the wall portions of the partitioning member.

2. The light emitting device according to claim 1, wherein each of the reflecting portions defines an opening in which a corresponding one of the apexes of the top portions of the wall portions of the partitioning member is disposed in the plan view.

3. The light emitting device according to claim 1, wherein a side surface of each of the reflecting portions adjacent to a corresponding one of the top portions of the wall portions of the partitioning member is slanted toward a corresponding one of the apexes of the top portions.

4. The light emitting device according to claim 1, wherein the reflecting portions are arranged at positions respectively overlapping the light sources in a plan view.

5. The light emitting device according to claim 1, wherein at least one sheet selected from a group consisting of a wavelength conversion sheet, a prism sheet and a polarizing sheet is arranged, directly or indirectly, on an upper surface of the light transmissive member.

6. The light emitting device according to claim 1, wherein each of the light sources has
   a light emitting element including the light emitting diode, and
   a light reflecting film arranged on an upper surface of the light emitting element.

7. The light emitting device according to claim 1, wherein each of the light sources has a batwing light distribution characteristic.

8. The light emitting device according to claim 1, wherein the light transmissive member is disposed such that a distance between the light transmissive member and the substrate is 0.25P or less, where P is a pitch between the top portions of the partitioning member.

9. The light emitting device according to claim 1, wherein each of the apexes of the top portions of the wall portions of the partitioning member forms an acute angle in a cross-sectional view.

10. The light emitting device according to claim 1, wherein
the partitioning member includes a plurality of bottom surfaces extending parallel to the substrate.

11. The light emitting device according to claim 10, wherein
each of the bottom surfaces of the partitioning member includes a through-hole in which the at least one of the light sources is arranged.

12. The light emitting device according to claim 1, wherein
the partitioning member is light reflective.

13. The light emitting device according to claim 1, further comprising
a plurality of additional reflecting portions arranged on an upper surface of the light transmissive member at positions respectively overlapping or surrounding the top portions of the wall portions of the partitioning member in a plan view.

14. The light emitting device according to claim 1, wherein
the light transmissive member defines a plurality of grooves,
each of the reflecting portions is disposed along a side wall of a corresponding one of the grooves.

15. The light emitting device according to claim 14, wherein
a depth of each of the grooves is at least one-half of a thickness of the light transmissive member.

16. The light emitting device according to claim 14, wherein
each of the grooves in the light transmissive member has a V-shape cross sectional shape.

17. A light emitting device comprising:
a substrate;
a plurality of light sources arranged on the substrate, each of the light sources having a light emitting diode;
a partitioning member including a plurality of wall portions defining a plurality of sections respectively surrounding at least one of the light sources, the wall portions including top portions;
a light transmissive member arranged above the light sources; and
a plurality of reflecting portions arranged on a lower surface of the light transmissive member, lower surfaces of the reflecting portions being positioned lower than apexes of the top portions of the wall portions of the partitioning member, wherein
the light transmissive member defines a plurality of grooves,
each of the reflecting portions is disposed along a side wall of a corresponding one of the grooves.

18. The light emitting device according to claim 17, wherein
a depth of each of the grooves is at least one-half of a thickness of the light transmissive member.

19. The light emitting device according to claim 17, wherein
each of the grooves in the light transmissive member has a V-shape cross sectional shape.

20. The light emitting device according to claim 19, wherein
an apex angle of the V-shape cross sectional shape of each of the grooves in the light transmissive member is equal to or larger than the acute angle of the apex of each of the top portions of the wall portions of the partitioning member.

* * * * *